United States Patent [19]

Schultz et al.

[11] 4,099,660
[45] Jul. 11, 1978

[54] APPARATUS FOR AND METHOD OF SHAPING INTERCONNECT LEADS

[75] Inventors: James Edward Schultz, Sunnyvale; Carmen D. Burns, San Jose, both of Calif.

[73] Assignee: National Semiconductor Corporation, Santa Clara, Calif.

[21] Appl. No.: 627,759

[22] Filed: Oct. 31, 1975

[51] Int. Cl.² .......................................... H01L 21/603
[52] U.S. Cl. ..................... 228/13; 228/6 A; 228/15.1; 228/170; 228/173 R; 72/54
[58] Field of Search ............... 228/6 A, 173, 180 A, 228/170, 13, 15.1; 29/203 V, 591; 219/85 F; 72/54

[56] References Cited
U.S. PATENT DOCUMENTS

| | | | |
|---|---|---|---|
| 3,520,055 | 7/1970 | Jannett | 228/180 A X |
| 3,724,068 | 4/1973 | Galli | 228/6 A |
| 3,859,718 | 1/1975 | Noe | 29/591 |
| 3,887,783 | 6/1975 | Comette | 228/180 A X |
| 3,949,925 | 4/1976 | Keizer et al. | 228/180 A X |

Primary Examiner—Donald G. Kelly
Assistant Examiner—K. J. Ramsey
Attorney, Agent, or Firm—Gail W. Woodward

[57] ABSTRACT

An apparatus for and method of shaping interconnect leads which have been cut from an interconnect lead tape and have a semiconductor chip attached thereto. With a semiconductor chip attached to the interconnect leads of one section of an interconnect lead tape, and either during or after cutting of such leads from the remaining portion of the tape by means of a punch and matrix, a pressure differential is developed across the leads and chip to shape the leads to a desired and repeatable uniform configuration. While this pressure differential is applied, the free ends of the leads are held in one plane, such that the semiconductor chip is translated to a position which is spaced from the plane in which the free ends of the leads are held, thus bending the leads to conform to this change in position. This shaping can occur either before, during, or after the free ends of such interconnect leads are bonded to a lead frame.

10 Claims, 2 Drawing Figures

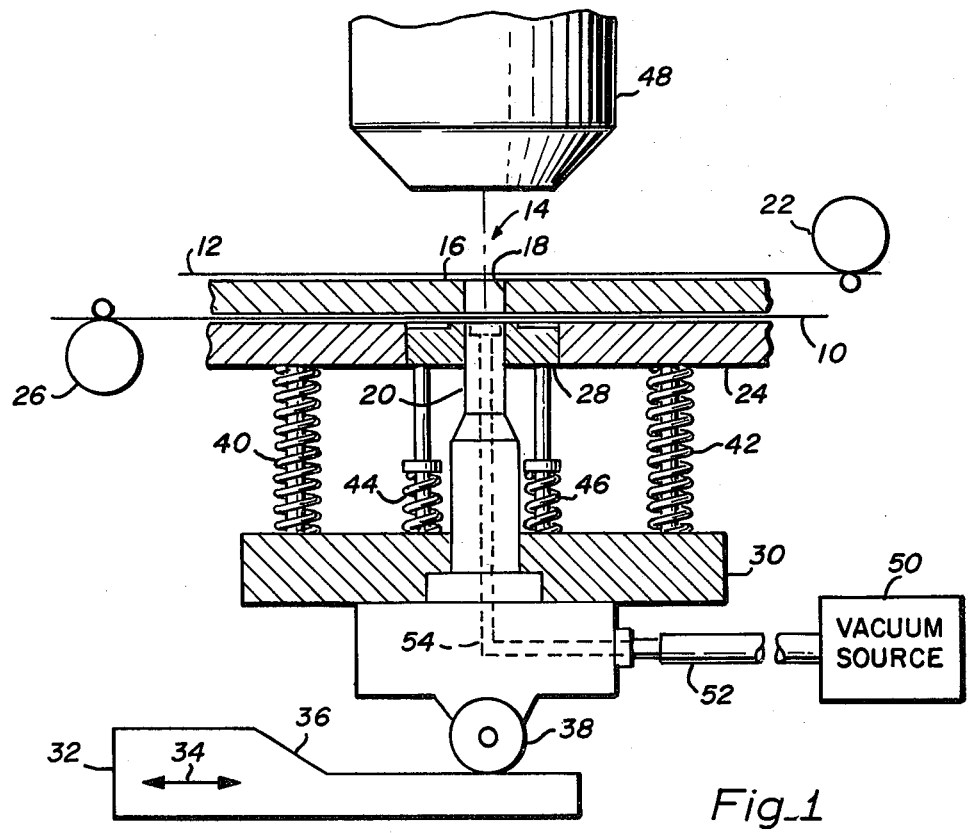
Fig_1
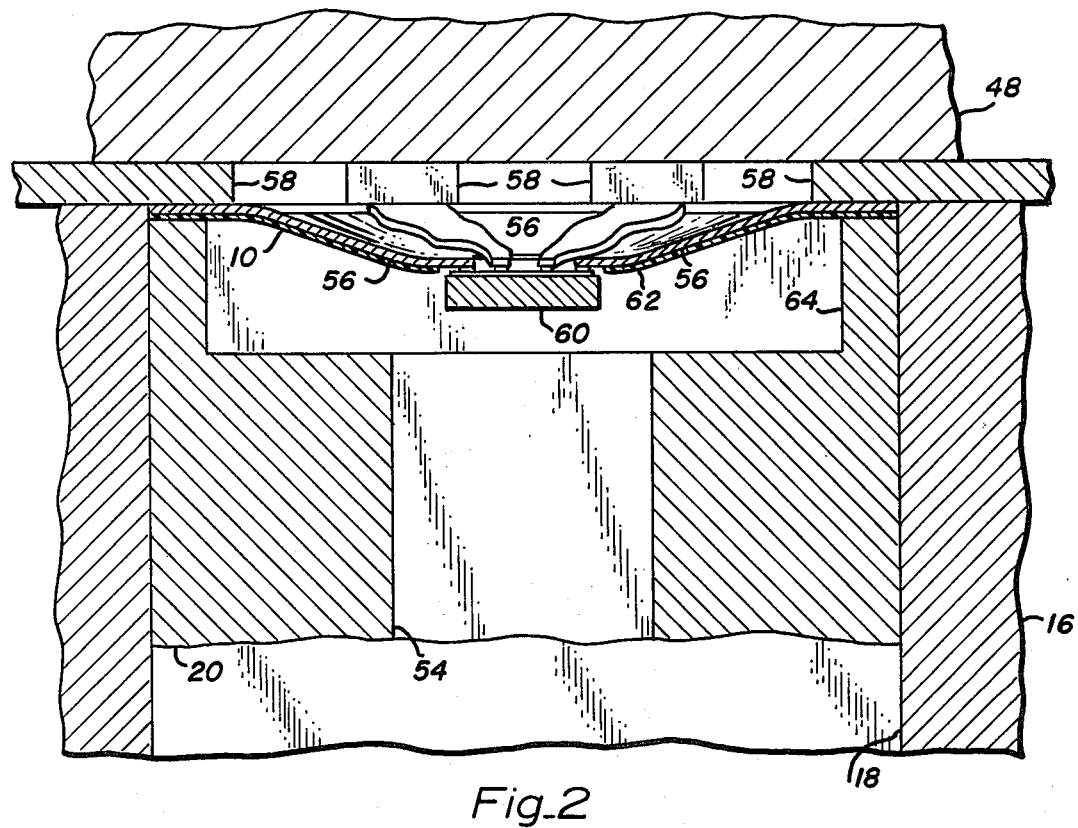
Fig_2

APPARATUS FOR AND METHOD OF SHAPING INTERCONNECT LEADS

BACKGROUND OF THE INVENTION

1. Field of the Invention

This invention relates to an apparatus for and method of shaping interconnect leads which have been cut from an interconnect lead tape and have a semiconductor chip attached thereto.

2. Prior Art

In the manufacture of semiconductor packages, a semiconductor chip must be electrically connected to the leads or fingers of a lead frame. In the past, this was accomplished by connecting a relatively small diameter wire between each pad of the semiconductor chip and a respective finger of the lead frame. This interconnect operation is time consuming and relatively expensive. Recently, interconnect lead tapes containing the leads for connecting the semiconductor chip to the fingers of a lead frame have been employed in place of the abovementioned interconnect wires.

When employing an interconnect lead tape, a semiconductor chip is first attached thereto by bonding the ends of the leads contained on the tape to respective bumps mounted on the pads of the semiconductor chip. Prior to this step in the operation, however, the semiconductor chips on a particular wafer are separated from one another by a saw, but are held in their original position by means of an adhesive backing. After the semiconductor chips are bonded to the ends of the interconnect tape leads, they are pulled off the adhesive backing. Following that step in the operation, the interconnect lead tape, with the semiconductor chips mounted on respective sections thereof, and a lead frame tape are placed in a machine which is capable of cutting out each section of the leads from the interconnect tape and bonding the severed ends thereof to respective fingers of the lead frame. Each section of the interconnect tape which is attached to a semiconductor chip and is to be removed from the remaining portion of the tape during this cutting operation is mounted on a relatively thin film or layer of polyimide which holds the leads together as a unitary article after they are severed.

When a semiconductor chip is removed from the adhesive backing on which it is mounted, the dynamics of the adhesive release control the shape of the interconnect leads to which it is bonded. That is, such pulling forces exerted by the interconnect leads on the semiconductor chip to remove it from its adhesive backing tend to bend the leads and create a basketing effect. However, because of the inconsistencies of the adhesive backing, the basketing effect from one set to another set of interconnect leads will be nonuniform. For example, the thickness of the adhesive may vary, such that different forces are required for separating different chips from the adhesive backing. These release or separation forces which are generated are directly related to the ultimate shape of the interconnect leads. One of the more serious problems which have been encountered is that of having one or more of the interconnect leads bent such that it is brought into contact with the substrate of the semiconductor chip, thereby creating an electrical short therebetween.

One of the solutions which has been considered to solve this problem involves the use of a mechanical probe for mechanically shaping or bending these interconnect leads after the semiconductor chip has been attached thereto. However, such a mechanical probe can create other problems which can be more serious than the problem caused by the uneven bending of the interconnect leads during release of the semiconductor chip attached thereto from its adhesive backing. Such a mechanical probe can cause damage to the semiconductor chip and/or to the interconnect leads. The use of such a mechanical probe involves contacting the chip and/or the ends of the interconnect leads which are attached to the chip and imparting a force thereto while holding the severed ends of the interconnect leads. Such a force must be sufficient to bend the interconnect leads and move the chip with respect to the held ends of the leads. However, such localized forces can cause damage to either the chip and/or the interconnect leads. Furthermore, such localized forces create stresses in the interconnect leads which may result in fracture thereof or in breaking the bond between the lead and a corresponding bump on the chip.

Another problem encountered in the use of a mechanical device to shape such interconnect leads is that of introducing or depositing foriegn matter on the chip and interconnect leads. Such a mechanical device is susceptible of accumulating debris thereon which can be transferred to the chip and the interconnect leads when brought into contact therewith. It has also been found desirable to heat the supportive film on which the interconnect leads are mounted to facilitate shaping thereof. The use of such a mechanical device to shape the leads requires the use of other means for heating the supportive film. Also, such a mechanical device is difficult to control.

SUMMARY OF THE INVENTION

It is, therefore, an object of the present invention to provide an apparatus for and method of shaping the interconnect leads which are employed for electrically connecting a semiconductor chip to a lead frame.

Another object of the present invention is to provide an apparatus for and method of shaping the interconnect leads which electrically connect a semiconductor chip to a lead frame to a desired and repeatably uniform configuration.

A further object of the present invention is to provide an apparatus for and method of shaping the interconnect leads connecting a semiconductor chip to a lead frame such that the possibility of an electrical short between such interconnect leads and the substrate of the semiconductor chip is greatly reduced.

These and other objects of the present invention are attained by holding the free ends of the interconnect leads in one plane after they have been severed from the interconnect lead tape, and applying a force to bend all of those leads uniformly and the same amount in one direction, such that the semiconductor chip attached thereto lies in a plane which is spaced from, but substantially parallel to the plane in which the free ends of the leads are held.

A feature of the present invention resides in the provision of means for heating the supportive film on which the interconnect leads are mounted to facilitate shaping of that film and, therefore, shaping of the interconnect leads.

The invention, however, as well as other objects, features and advantages thereof will be more fully realized and understood from the following detailed description, when taken in conjunction with the accompanying drawing, wherein:

BRIEF DESCRIPTION OF THE DRAWING

FIG. 1 is an elevational view, partially in section, of an interconnect tape cutting and bonding apparatus constructed in accordance with the principles of the present invention.

FIG. 2 is an enlarged, broken-away, and sectional view of a portion of the apparatus illustrated in FIG. 1.

DETAILED DESCRIPTION OF THE PREFERRED EMBODIMENT

With reference to FIG. 1, there is shown an apparatus for severing the interconnect leads and the polyimide film on which they are supported from the remaining portion of an interconnect lead tape 10 and bonding the severed ends thereof to respective fingers of a lead frame on a lead frame tape 12. The apparatus includes a die, generally designated with the reference numeral 14, which includes a matrix 16 having an opening 18 therein, and a punch 20. The matrix 16 forms a platform for receiving and supporting the lead frame tape 12 thereon. The lead frame tape 12 is translated across the top surface of the matrix 16 and the opening 18 therein by means of a driven roller 22, for example, Although not shown, the top surface of the matrix 16 includes a groove which forms a track for the lead frame 12.

A platform 24 is disposed for receiving and supporting the interconnect lead tape 10 on an upper surface thereof. Preferably, a groove, which is not shown, is also provided in the upper surface of the platform 24 which forms a track for the interconnect lead tape 10. The tape 10 is translated along the surface of the platform 24 by means of a driven roller 26 for example. A clamping member 28 is mounted in a central aperture of the platform 24 and is provided with an opening therein which is aligned with the opening 18 and receives the cutting end of the punch 20 therein. The clamping member 28 is slideably mounted in the aperture of the platform 24 and is actuatable to clamp a section of the tape 10 against that portion of the underside of the matrix 16 which surrounds the periphery of the opening 18 therein.

The punch 20 is mounted in and extends from a base member 30. An actuating member 32 is movable in a direction as indicated by the double headed arrow designated with the reference numeral 34 by appropriate translating means which is not shown. The actuating member 32 includes an inclined surface 36 which is disposed for engaging a roller 38 mounted on the base member 30. A pair of springs 40 and 42 are mounted between the platform 24 and the base member 30, such that the base member 30 is biased in a downward direction. Also, a pair of springs 44 and 46 are mounted between the clamping member 28 and the base member 30. When the actuating member 32 is in its illustrated position, the springs 44 and 46 are at or near an uncompressed state.

Translation of the actuating member 32 to the right as viewed in FIG. 1 will cause the base member 30 to be translated vertically in an upward direction when the inclined surface 36 engages the roller 38. Such upward movement of the base member 30 causes the clamping member 28 and punch 20 to move together in an upward direction until the clamping member 28 is restrained from further vertical movement. At that point, a section of the interconnect tape 10 will be clamped around the outer periphery of the opening 18. Continued movement of the base member 30 in an upward direction will cause the cutting end of the punch 20 to sever the interconnect leads and supportive film from the remaining portion of the tape 10 as it enters the opening 18 in the matrix 16. Further upward movement of the base member 30 will cause the punch 20 to carry the severed interconnect leads to the top of the opening 18. When a bonding tool 48, which is heated to a relatively high temperature, such as in the range of from 400° to 600° C, is translated in a downward direction, it will bear against the lead frame 12 and force it into contact with the interconnect leads supported on the cutting end or face of the punch 20. The tool 48 performs a thermal compression bonding of the fingers of the lead frame to the severed ends of the interconnect leads.

One of the problems which has been encountered by the apparatus which has been described to this point is that the cutting operation may result in damage to the semiconductor chip and/or the interconnect leads to which it is secured, or it may alter the position of the interconnect leads, thereby resulting in misalignment thereof with the fingers of the lead frame. This problem is the direct result of the inability of the die 14 to sever all of the interconnect leads simultaneously or to simultaneously sever all edges of the supportive film. It can be appreciated that if one of the interconnect leads is not completely severed after all of the remaining interconnect leads are severed as the punch 20 is being translated through the opening 18, the interconnect leads, as a unit, will skew. This problem becomes more severe with wear of the cutting edges of the matrix 16 and punch 20.

This problem is overcome by holding the interconnect leads, which are joined together by a polyimide film or layer, against the face of the punch 20. This is accomplished by applying a pressure differential across the interconnect leads. This pressure differential is created by a vacuum source 50 connected by a flexible tube 52 to a channel 54 which extends through the base member 30 and the punch 20 to a recess in the face of the punch 20. Because of the relatively wide spacing between the fingers of the lead frame 12, the area above the tape 10 will be at atmospheric pressure. However, because of the polyimide film which supports the interconnect leads and because of the semiconductor chip which is attached to the interconnect leads, only a few, and relatively small openings are provided through that portion of the tape 10 which bears against the face of the punch 20. Accordingly, a pressure differential will be created across that portion of the tape 10 which is supported on the face of the punch 20. In addition, this pressure differential alters the shape of the interconnect leads to a desired and repeatably uniform configuration.

With reference to FIG. 2, there is shown an enlarged and detailed view of the position of the elements of the machine illustrated in FIG. 1 when the interconnect leads, having a semiconductor chip attached thereto, are being bonded to the fingers of a lead frame. As shown therein, a severed section of the interconnect lead tape 10 is supported on the cutting end or face of the punch 20, with the free ends of the interconnect leads 56 in engagement with respective ends of the fingers 58 of the lead frame 12. The interconnect leads 56 are each connected to a respective bump on a semiconductor chip 60. Also, the bonding tool 48 is in contact with an upper surface of the lead frame 12. It will also be seen in FIG. 2 that the interconnect leads 56 are supported on a polyimide film 62.

A recess 64 is provided in the face of the punch 20 and is in fluid communication with the passage 54 extending through the punch 20 to the vacuum source 50. Because of the relatively large opening between the fingers 58 of the lead frame 12, the area above the interconnect leads 56 will be at or very near atmospheric pressure. When a vacuum exists in the passage 54, a pressure differential will be developed across the interconnect leads 56, the polyimide film 62, and the semiconductor chip 60 to bend the interconnect leads 56 to the position illustrated in FIG. 2. Since the bonding tool 48 is at a relatively high temperature, the matrix 16 and punch 20 will also be at an elevated temperature as the result of heat radiation and conduction from the tool 48. This elevated temperature will transfer heat to the polyimide film 62, thereby softening it and permitting it to be formed more readily. Although the ultimate temperature to which the polyimide film is heated is not known, it is believed that the matrix 16 and punch 20 attain a temperature in the neighborhood of 200° C. Polyimide film will soften at temperatures in the neighborhood of 100° C and can withstand heat for brief periods at a temperature of 550° C. Accordingly, the present invention is concerned with heating the polyimide film to a temperature in the range of from 100° to 550° C.

In essence, the free ends of the interconnect leads 56 are held in one plane while a pressure differential is applied across the interconnect leads 56, the semiconductor chip 60 and the polyimide film 62 to bend the interconnect leads 56 and deform the polyimide film 62 to position the semiconductor chip 60 in a plane which is parallel to, but spaced from the plane in which the free ends of the interconnect leads 56 are held. It can be appreciated that this shaping of the interconnect leads 56 insures that the interconnect leads 56 will not be in contact with the substrate of the chip 60. If, for example, the semiconductor chip is skewed from the position illustrated in FIG. 2, it is possible for one of the interconnect leads 56 to be in contact with the substrate of the chip 60. The present invention overcomes this problem by uniformly bending all of the interconnect leads 56 the same amount.

Although the present invention has been described in connection with a cutting and bonding operation, it can be appreciated that the interconnect leads 56 can be shaped after the cutting operation has been completed and either before, during, or after bonding of the interconnect leads 56 to the fingers 58 of the lead frame 12. In the disclosed embodiment of the present invention, a pressure differential is formed by vacuum source 50. However, it can be appreciated that this pressure differential can be generated by maintaining the area below the interconnect leads 56 at ambient pressure and applying a greater than ambient pressure to the area above the leads.

We claim:
1. A method of shaping interconnect leads which have been cut from an interconnect lead tape and which are each joined to a respective bump on a semiconductor chip, such that said leads and chip form a unitary article, comprising the steps of:
   (a) holding the free ends of said leads in one plane, and
   (b) applying a differential fluid pressure across said article to bend all of said leads uniformly and the same amount downwardly, whereby the chip is translated downwardly to a position which is spaced below said one plane in which the free ends of said leads are held.

2. The method of claim 1 wherein said differential fluid pressure is obtained by creating a vacuum on one side of said article while the other side thereof is maintained substantially at atmospheric pressure.

3. The method of claim 1, wherein said interconnect leads are mounted on a film, and wherein said step of applying includes the step of creating a differential pressure across said article and said film.

4. The method of claim 3, further comprising the step of heating said film above 100° C.

5. A tool for shaping interconnect leads which have been cut from an interconnect lead tape and which are joined to a repsective bump on a semiconductor chip, such that said leads and chip form a unitary article, comprising:
   (a) means for holding the free ends of said leads in one plane, and
   (b) means for applying a differential fluid pressure across said article to bend all of said leads uniformly and the same amount downwardly, whereby the chip is translated to a position which is spaced below said one plane in which the free ends of said leads are held.

6. The tool of claim 5 wherein said means for applying a differential fluid pressure includes means for creating a vacuum on one side of said article while the other side thereof is maintained substantially at atmospheric pressure.

7. The tool of claim 5, wherein said interconnect leads are mounted on a film, and further comprising means for heating said film above 100° C.

8. The tool of claim 7, wherein said heating means includes a bonding tool.

9. The tool of claim 5, wherein said holding means includes a punch and respective fingers of a lead frame, with the free ends of said leads being held between a cutting face of said punch and said fingers.

10. The tool of claim 9, wherein said punch includes a recess in the face thereof and a passage extending from the recess and through said punch, and wherein said applying means includes a vacuum source connected to said passage to create a less than atmospheric pressure in said recess.

* * * * *